United States Patent
Qin et al.

(10) Patent No.: US 9,143,098 B2
(45) Date of Patent: Sep. 22, 2015

(54) SYSTEMS AND METHODS FOR BIASING AMPLIFIERS WITH ADAPTIVE CLOSED LOOP CONTROL

(71) Applicant: Aviat U.S., Inc., Santa Clara, CA (US)

(72) Inventors: Youming Qin, Sunnyvale, CA (US); Frank Matsumoto, San Ramon, CA (US); Andres Goytia, Santa Clara, CA (US); Cuong Nguyen, San Jose, CA (US)

(73) Assignee: Aviat U.S., Inc., Santa Clara, CA (US)

( * ) Notice: Subject to any disclaimer, the term of this patent is extended or adjusted under 35 U.S.C. 154(b) by 0 days.

(21) Appl. No.: 14/150,721

(22) Filed: Jan. 8, 2014

(65) Prior Publication Data

US 2014/0191807 A1 Jul. 10, 2014

Related U.S. Application Data

(60) Provisional application No. 61/750,308, filed on Jan. 8, 2013.

(51) Int. Cl.
| | |
|---|---|
| *H03F 3/04* | (2006.01) |
| *H03G 3/10* | (2006.01) |
| *H03F 3/21* | (2006.01) |
| *H03F 3/19* | (2006.01) |
| *H03F 1/02* | (2006.01) |
| *H03F 3/24* | (2006.01) |

(52) U.S. Cl.
CPC ............... *H03F 3/21* (2013.01); *H03F 1/0261* (2013.01); *H03F 3/19* (2013.01); *H03F 3/245* (2013.01)

(58) Field of Classification Search
USPC .......................................... 330/285, 296, 278

IPC ....................................... H03G 3/10; H03F 3/04
See application file for complete search history.

(56) References Cited

U.S. PATENT DOCUMENTS

| | | | |
|---|---|---|---|
| 4,463,272 A | | 7/1984 | Tucker |
| 4,924,191 A | * | 5/1990 | Erb et al. .................... 330/130 |
| 5,426,641 A | * | 6/1995 | Afrashteh et al. ............ 370/347 |
| 5,451,907 A | * | 9/1995 | Keane et al. ................. 330/296 |
| 5,886,575 A | | 3/1999 | Long |
| 6,043,706 A | | 3/2000 | Nowak et al. |
| 6,049,704 A | | 4/2000 | Peckham et al. |
| 6,178,313 B1 | * | 1/2001 | Mages et al. ............... 455/127.2 |
| 6,304,145 B1 | * | 10/2001 | Laureanti et al. ............ 330/285 |
| 6,351,189 B1 | * | 2/2002 | Hirvilampi .................. 330/296 |

(Continued)

FOREIGN PATENT DOCUMENTS

GB 2401264 11/2004

OTHER PUBLICATIONS

International Application No. PCT/US2014/017190, International Search Report and Written Opinion mailed May 30, 2014.

(Continued)

*Primary Examiner* — Patricia T Nguyen
(74) *Attorney, Agent, or Firm* — Sheppard, Mullin, Richter & Hampton LLP

(57) ABSTRACT

Various embodiments described herein provide systems and methods for improved performance for power amplifiers, particularly GaN power amplifiers. According to some embodiments, a power amplifier (e.g., GaN power amplifier) utilizes an adaptive closed loop control of the drain current of the power amplifier to achieve improved performance for the power amplifier.

21 Claims, 7 Drawing Sheets

(56) References Cited

U.S. PATENT DOCUMENTS

| | | |
|---|---|---|
| 6,424,211 B1 | 7/2002 | Nolan et al. |
| 6,515,545 B1 | 2/2003 | Hu et al. |
| 6,549,068 B1 | 4/2003 | Bollenbeck |
| 6,603,356 B1 | 8/2003 | Kim et al. |
| 6,614,309 B1 | 9/2003 | Pehlke |
| 7,268,626 B2 | 9/2007 | Anand |
| 8,195,103 B2 | 6/2012 | Waheed et al. |
| 8,295,794 B2 | 10/2012 | Agarwal |
| 2002/0171478 A1 | 11/2002 | Wouters |
| 2002/0183019 A1 | 12/2002 | Dent et al. |
| 2003/0160654 A1 | 8/2003 | Fischer et al. |
| 2003/0201834 A1 | 10/2003 | Pehlke |
| 2005/0270054 A1 | 12/2005 | Van Hees |
| 2006/0132230 A1 | 6/2006 | Douglas |
| 2008/0002983 A1 | 1/2008 | Ishikawa et al. |
| 2008/0125061 A1 | 5/2008 | Kuriyama et al. |
| 2010/0151804 A1 | 6/2010 | Song et al. |
| 2010/0273431 A1 | 10/2010 | Fraser et al. |
| 2011/0221523 A1 | 9/2011 | Dupis et al. |
| 2011/0279185 A1 | 11/2011 | Lautzenhiser |
| 2012/0313709 A1 | 12/2012 | Lautzenhiser |
| 2012/0326778 A1 | 12/2012 | Nadimpalli et al. |
| 2014/0118074 A1 * | 5/2014 | Levesque et al. ............. 330/296 |

OTHER PUBLICATIONS

International Application No. PCT/US2014/031914, International Search Report and Written Opinion mailed Aug. 11, 2014.
International Application No. PCT/US2014/010758, International Search Report and Written Opinion mailed May 2, 2014.

\* cited by examiner

SYSTEMS AND METHODS FOR BIASING AMPLIFIERS WITH ADAPTIVE CLOSED LOOP CONTROL

CROSS-REFERENCE TO RELATED APPLICATIONS

The present application claims the benefit of U.S. Provisional Patent Application Ser. No. 61/750,308, filed Jan. 8, 2013 and entitled "System and Method for Biasing GaN Amplifiers with Adaptive Closed Loop Control," which is incorporated by reference herein.

BACKGROUND

1. Field of the Invention(s)

The present invention(s) relate to power amplifiers, and more particularly, some embodiments relate to systems and methods for improved power amplifier performance.

2. Description of Related Art

The radio frequency (RF) power amplifiers and devices using Gallium Nitride (GaN) have benefits over other technologies such as gallium arsenide (GaAs). For example, GaN-based power amplifiers have exceptional power density (i.e., increased power per square millimeter of die) and exceptional power efficiency characteristics. Unfortunately, one of the challenges of using GaN-based power amplifiers is controlling the quiescent current ($I_q$) of such power amplifiers over a period of time. FIG. 1 provides a chart depicting the drift of the quiescent drain current ($I_{dq}$) of an example GaN power amplifier over time. Such drift impacts certain systems, because as the quiescent drain current ($I_{dq}$) of a GaN power amplifier changes, so does the performance of the GaN power amplifier. One solution to this is a "burn-in" procedure, whereby a GaN power amplifier is energized until the quiescent drain current ($I_{dq}$) of the GaN power amplifier stabilizes. The "burn-in" procedure, however, is time consuming, it is difficult to tell how much time will be required for $I_{dq}$ stabilization (as it is difficult to predict the drift of the quiescent drain current over long periods of time), and a GaN power amplifier cannot be biased at a constant drain current for its drain current varies according with its RF power output.

SUMMARY OF EMBODIMENTS

Various embodiments described herein provide systems and methods for improved performance for power amplifiers, particularly GaN power amplifiers. According to some embodiments, a power amplifier (e.g., GaN power amplifier) utilizes an adaptive closed loop control of the drain current of the power amplifier to achieve improved performance for the power amplifier.

According to some embodiments, a system is provided comprising a power amplifier having an output signal and a drain current, a power amplifier calibration module, a storage module, and a power amplifier operation module. The power amplifier may be a GaN power amplifier. The power amplifier calibration module may determine an optimized quiescent drain current value for the drain current while the power amplifier is operating under an operational parameter. The power amplifier calibration module also determine a set of calibrated drain current values for the drain current, the set of calibrated drain current values being calibrated for a set of power levels for the output signal while the power amplifier is operating under the operational parameter.

The storage module may store the optimized quiescent drain current value and the set of calibrated drain current values as saved drain current data. Depending on the embodiment, the storage module may store the saved drain current data on a memory, datastore, or the like. Storing the optimized quiescent drain current value may comprise storing the optimized quiescent drain current value in association with the operational parameter. Additionally, storing the set of calibrated drain current values may comprise storing the set of calibrated drain current values in association with the operational parameter or the set of power levels.

The power amplifier operation module may compare the drain current of the power amplifier to a particular drain current value obtained from the saved drain current data. The power amplifier may subsequently determine whether the comparison satisfies a condition and, if it does, adjust the drain current based on the particular drain current value. In addition, the condition may be that a difference between the drain current and the particular drain current value from the saved drain current data is less than, equal to, or larger than a predetermined value. The condition, for example, may be that when the difference is larger than a predefined limit (e.g., threshold), the drain current of the power amplifier is adjusted to the particular drain current value.

Adjusting the drain current based on the calibrated drain current may comprise adjusting the drain current to match or substantially match the particular drain current value from the saved drain current data. For some embodiments, this is achieved by adjusting a voltage bias of the power amplifier such that the drain current matches or substantially matches the particular drain current value from the saved drain current data.

Depending on the embodiment, the particular drain current value may be an optimized quiescent drain current or a calibrated drain current value previously stored to the saved drain current data. Further, the particular drain current value obtained from the saved drain current data may be one associated with a current operational parameter of the power amplifier.

The operational parameter may comprise a frequency of an input signal of the power amplifier, a phase of the input signal of the power amplifier, a power level of the input signal of the power amplifier, or a temperature of the power amplifier. Additionally, depending on the embodiment, the operational parameter comprises a plurality of operational parameters.

According to various embodiments, a system comprises a master device and at least one slave device, each of which includes some or all of the components or functionality described herein. Additionally, in some embodiments, a computer system, or a computer program product, comprises a computer readable medium having computer program code (i.e., executable instructions) executable by a processor to perform various steps and operation described herein. For example, the systems and methods described herein may be implemented, in whole or in part, as a microcontroller that operates in connection with a power amplifier.

BRIEF DESCRIPTION OF THE DRAWINGS

The drawings are provided for purposes of illustration only and merely depict typical or example embodiments. These drawings are provided to facilitate the reader's understanding and shall not be considered limiting of the breadth, scope, or applicability various embodiments.

Figure 1:
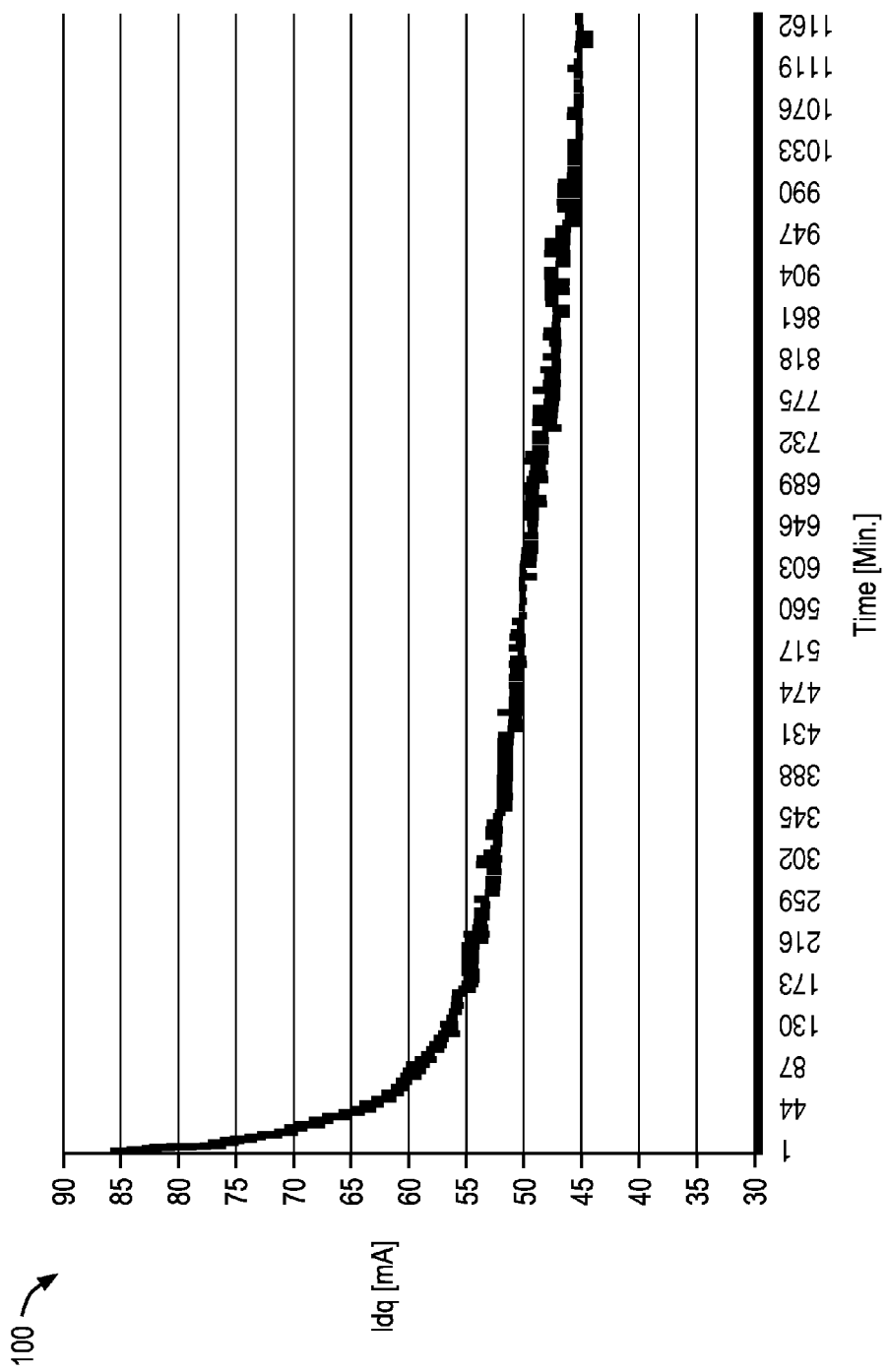
FIG. 1 is a chart depicting a drift of a quiescent drain current ($I_{dq}$) of a power amplifier over time.

The figures are not intended to be exhaustive or to limit the embodiments to the precise form disclosed. It should be understood that various embodiments may be practiced with modification and alteration.

DETAILED DESCRIPTION OF VARIOUS EMBODIMENTS

Various embodiments described herein provide systems and methods for improved performance for power amplifiers, particularly GaN power amplifiers. According to some embodiments, a power amplifier (e.g., GaN power amplifier) utilizes an adaptive closed loop control of the drain current of the power amplifier to achieve improved performance for the power amplifier.

Various embodiments apply to a power amplifier having an input signal, an output signal, and a drain current. The power amplifier may be a GaN power amplifier, which may be operated a power amplifier or a driver amplifier. Various embodiments utilize the observation that the drain current ($I_d$) of a GaN power amplifier varies proportionally to the quiescent drain current ($I_{dq}$) of the GaN power amplifier, particularly when for the GaN amplifier operating lower than its power compression point ($P_{sat}$). A GaN power amplifier may, for instance, operate lower than its power compression point ($P_{sat}$) where the GaN power amplifier is used in linear modulation applications (e.g., 256 QAM modulation). For some embodiments, an adaptive closed loop control can leverages the proportional variation between the drain current ($I_d$) and the quiescent drain current ($I_{dq}$) and control the GaN power amplifier accordingly, particularly with respect to controlling the quiescent drain current ($I_{dq}$) of the GaN power amplifier.

According to some embodiments, an adaptive closed loop control it utilized with a power amplifier to control the drain current of the power amplifier during two phases: a calibration phase and an operation phase. During the calibration phase, various embodiments gather and save information (e.g., a datastore or map) regarding drain current values of a power amplifier during quiescent operation and non-quiescent operation, and while the power amplifier is operating under one or more operational parameters (e.g., input frequency, input phase, temperature, output power level, etc.). During the operation phase, various embodiments utilize information saved from the calibration phase to adaptively control the drain current of the power amplifier, during quiescent operation and non-quiescent operation, based on present operational parameters of the power amplifier. In doing so, the power amplifier optimal or near optimal operation can be achieved for application of the power amplifier, and with predictable behavior of the drain current of the power amplifier.

For various embodiments, dynamic control (e.g., adjustment) of a drain current of a given power amplifier is achieved by dynamically controlling (e.g., adjusting) a bias of given the power amplifier. For some embodiments, the power amplifier bias being dynamically controlled is associated with a gate of the given power amplifier (e.g., a gate voltage). Additionally, in some embodiments, controlling a drain current of a given power amplifier comprises measuring the drain current as the bias of the given power amplifier is controlled.

During the calibration phase, a quiescent drain current ($I_{dq}$) of the power amplifier may be optimized for the performance requirements of a particular application of the power amplifier. For example, where a power amplifier is being used in a transmitter, such as a radio frequency unit such as the one depicted and described herein with respect to FIG. 2, the quiescent drain current ($I_{dq}$) of the power amplifier may be optimized for a transmission spectrum that meets regulatory (e.g., FCC) requirements of the transmitter and performance requirements of the transmitter (e.g., amplifying RF signals at microwave frequencies).

Optimizing the quiescent drain current ($I_{dq}$) of the power amplifier may comprise determining one or more quiescent drain current ($I_{dq}$) values for the power amplifier for one or more operational parameters under which the power amplifier may be operated, or is expected to operate, when used in a particular application of the power amplifier (e.g., user of the power amplifier in an radio frequency unit [RFU] transmitter). Examples of operational parameter can include, without limitation, a frequency, phase, or power level of an input signal received by the power amplifier for amplification to an output signal. Other examples of operational parameters can include a power level of the output of the power amplifier (e.g., power level of output signal), a temperature of the power amplifier (e.g., as a whole or of particular components) and a temperature around the power amplifier (e.g., ambient temperature). Examples of operational parameters can also include whether the power amplifier is operating in a quiescent mode (i.e., the power amplifier is drawing quiescent current) or non-quiescent mode (i.e., the power amplifier is drawing non-quiescent current).

For instance, during calibration of a power amplifier, optimization of a quiescent drain current ($I_{dq}$) of the power amplifier may occur for the permutations of the following operational parameters of the power amplifier: a set of frequencies $F=\{f_1, f_2, f_3, \ldots f_p\}$ expected for the input signals; and a set of power amplifier temperatures $T=\{t_1, t_2, t_3, \ldots t_m\}$ expected during operation of the power amplifier. During calibration, temperatures of the power amplifier may be controlled through a testing or calibration chamber (e.g., which may be used during the power amplifier's time of manufacture). The quiescent drain current ($I_{dnq}$) values determined during the calibration phase may be regarded as a set of optimized quiescent drain current ($I_d$) values for the power amplifier while operating under the operational parameters.

Determining one or more quiescent drain current ($I_{dq}$) values for the power amplifier operating under the operational parameters may comprise adjusting the quiescent drain current ($I_{dq}$) of the power amplifier, while the power amplifier is operating under the operational parameters, such that the quiescent drain current ($I_{dq}$) meets satisfies one or more requirements of the power amplifier's intended application. As noted herein, the quiescent drain current ($I_{dq}$) of the power amplifier can be adjusted by controlling the bias of the power amplifier. When the quiescent drain current ($I_{dq}$) satisfies the requirements of the power amplifier's intended application, the bias value used to reach the quiescent drain current ($I_{dq}$) may be recorded. For some embodiments, a spectrum analyzer is utilized to determine whether a given quiescent drain current ($I_{dq}$) satisfies a requirement of the power amplifier's intended application.

The one or more quiescent drain current ($I_{dq}$) values determined for the power amplifier may be stored (e.g., as saved drain current data) in a datastore (e.g., flash memory, possibly in some type of database) for future data retrieval and use during the operation phase of the power amplifier. The quiescent drain current ($I_{dq}$) values may be stored according to their one or more corresponding operational parameters, thereby permitting future retrieval based on those operational parameters.

During the calibration phase, a non-quiescent drain current ($I_{dnq}$) of the power amplifier may be calibrated over a set of power levels for the output signal of the power amplifier, thereby resulting in a set of calibrated drain current ($I_d$) values for the power amplifier. Calibrating the non-quiescent drain current ($I_{dnq}$) of the power amplifier over a set of power levels may comprise determining a set of non-quiescent drain current ($I_{dnq}$) values for the power amplifier for the set of power levels and one or more additional operational parameters under which the power amplifier may be operated, or is expected to operate, when used in a particular application of the power amplifier (e.g., user of the power amplifier in RFU transmitter).

For example, calibration of a power amplifier may comprise determining one or more non-quiescent drain current ($I_d$) values for the power amplifier for permutations of the following operational parameters of the power amplifier: a set of power levels $P=\{p_1, p_2, p_3, \ldots p_n\}$ of an output signal of the power amplifier; a set of frequencies $F=\{f_1, f_2, f_3, \ldots f_p\}$ expected for the input signals; and a set of temperatures for the power amplifier $T=\{t_1, t_2, t_3, \ldots t_m\}$ expected during operation of the power amplifier. The non-quiescent drain current ($I_{dnq}$) values determined during the calibration phase may be regarded as a set of calibrated drain current ($I_d$) values for the power amplifier while operating under the operational parameters.

The non-quiescent drain current ($I_{dnq}$) values determined for the power amplifier may be stored (e.g., as saved drain current data) in a datastore (e.g., flash memory, possibly in some type of database) for future data retrieval and use during the operation phase of the power amplifier. The non-quiescent drain current ($I_{dnq}$) values may be stored according to their one or more corresponding operational parameters, including the set of power levels. By doing so, the non-quiescent drain current ($I_{dnq}$) values can be subsequently retrieved based on those operational parameters.

For some embodiments, during the calibration phase, a power amplifier is not being utilized by it intended application. For example, where the power amplifier is being used in a radio frequency unit (RFU), the power amplifier may not be in use by the RFU during a calibration process.

During the operation phase, the unit (e.g., RFU) in which the power amplifier is installed may be powered up, a processor (e.g., microcontroller of the unit) may determine (e.g., measure) a present value of the drain current of the power amplifier, and the processor may compare the present drain current value to a saved drain current value (e.g., an optimized quiescent drain current value or a calibrated drain current value) determined during the calibration phase. For some embodiments, the saved drain current value is obtained from the saved drain current data stored during the calibration phase. Additionally, for some embodiments, the saved drain current value to which the present drain current value is compared is a saved drain current value that associated with one or more present operational parameters under which the power amplifier is presently operating while the unit is operating (e.g., powered up).

Based on whether the difference between the present drain current value and the saved drain current value satisfies a particular condition, the processor may maintain the drain current at its present drain current value or control (e.g., adjust) the drain current to match or sufficiently match the saved drain current value. The particular condition, for example, (e.g., difference is equal to, more than, less than, more than or equal to, or less than or equal to a predetermined value. The difference may be regarded as the error of the present drain current value in view of the saved drain current value, and the predetermined value may be regarded as an error limit. The particular condition may be determined based on, and vary according to, the intended application of the power amplifier. The particular condition may, for example, correspond to one or more operational constraints (e.g., drain current tolerances) for the power amplifier while it operates in its intended application. In this way, while the power amplifier is operating under a given set of operational parameters, the processor can control the drain current of the power amplifier, based on the drain current values obtained during the calibration phase, such that the power amplifier operates at or at or near optimal levels for the given set of operational parameters.

In one example, after the unit including the power amplifier is turned on, the processor may, at time t, check the present drain current value for the drain current of the power amplifier and determine the following operational parameters under which the power amplifier is presently operating associated with the present drain current value: the present power level $p_t$ for an output signal of the power amplifier; a frequency $f_t$ of an input signal of the power amplifier; and a power amplifier temperature $t_t$. The present drain current value at time t associated with the present operational parameter at time t can be represented herein as $I_{dt}(p_t, f_t, t_t)$. Based on the present operational parameters of $p_t$, $f_t$, and $t_t$ at time t, the processor can obtain (e.g., saved drain current data) a saved drain current value associated with the present operational parameters of $p_t$, $f_t$, and $t_t$ at time t. The saved current drain current value at time t associated with the present operational parameter at time t can be represented herein as $I_{ds}(p_t, f_t, t_t)$. The processor may calculate the absolute difference between $I_{dt}(p_t, f_t, t_t)$ between $I_{ds}(p_t, f_t, t_t)$ and determine whether the calculated difference is less than or equal to an error limit $\epsilon$, as follows:

$$|I_{dt}(p_t, f_t, t_t) - I_{ds}(p_t, f_t, t_t)| \leq \epsilon.$$

If the calculated difference is less than or equal to an error limit $\epsilon$, the processor may maintain (e.g., keep) the drain current at the present drain current value $I_{dt}(p_t, f_t, t_t)$. If otherwise, the process may adjust the drain current to match the saved current drain current $I_{ds}(p_t, f_t, t_t)$. For some embodiments, adjusting the drain current to match the saved current drain current $I_{ds}(p_t, f_t, t_t)$ comprises slowing, by a set time (e.g., Tsecs), the adaptive closed control loop (e.g., a proportional-integral-derivative [PID] loop) being performed by the processor. By slowing the adaptive closed control loop, some embodiments improve control by the adaptive closed control loop (e.g., prevent or reduce overshoot by the adaptive closed control loop when adjusting the drain current of the power amplifier).

During the operation phase, the processor may continually or periodically (e.g., based on a time delay) processor determine a present value of the drain current of the power amplifier, compare the present drain current value to a saved drain current value, and adjust or maintain the present current drain value accordingly. By doing so, the processor can continually or periodically adapt the drain current according to one or more of the latest operational parameters under which the power amplifier is operating.

For some embodiments, systems and methods described herein eliminate the need for a "burn-in" procedure for a GaN device or reduce the burn-in time for the GaN device. Systems and methods described herein may maintain long term performance for a GaN device, may improve GaN device reliability and mean time between failures (MTBF), and may achieve optimum operating conditions for a GaN device in different applications. For example, with respect to a GaN power amplifier, various systems and methods described herein may stabilize the GaN power amplifier's performance, maximize its performance for different applications, reduce its production time, or lower its manufacturing cost.

Figure 2:
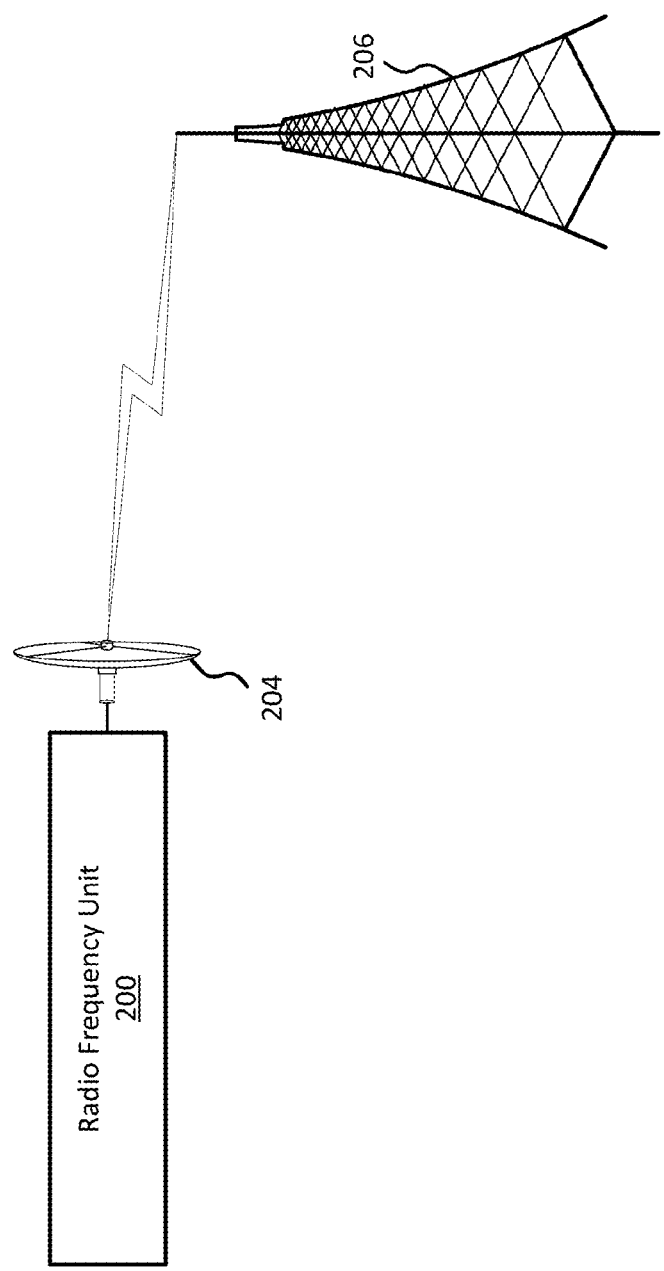
FIG. 2 depicts an example radio frequency unit (RFU) that can utilize a power amplifier in accordance with some embodiments.

FIG. 2 depicts an example radio frequency unit (RFU) 200 that can utilize a GaN power amplifier in accordance with some embodiments. In FIG. 2, the RFU 200 provides a wireless signal to a wireless communication tower 206 (e.g., cell tower or other microwave radio device) via an antenna 204. To provide the wireless signal, the RFU 200 may comprise a GaN power amplifier in accordance with embodiments described herein. Gallium Nitride (GaN) is a wide-band gap semiconductor material that may be operated at a high drain voltage (e.g., in the range of 20 V to 60 V) and may also offer a higher output power capability (e.g., in the range of 4-8 W/mm). As a result, GaN power amplifiers may be easier to match over a wider bandwidth, have better reliability, and improved ruggedness compared to GaAs devices. In addition, the use of a linearization circuitry can allow the operation of the final stage power amplifier in a class AB or Class B mode thus affording much higher power added efficiency (PAE).

Figure 3:
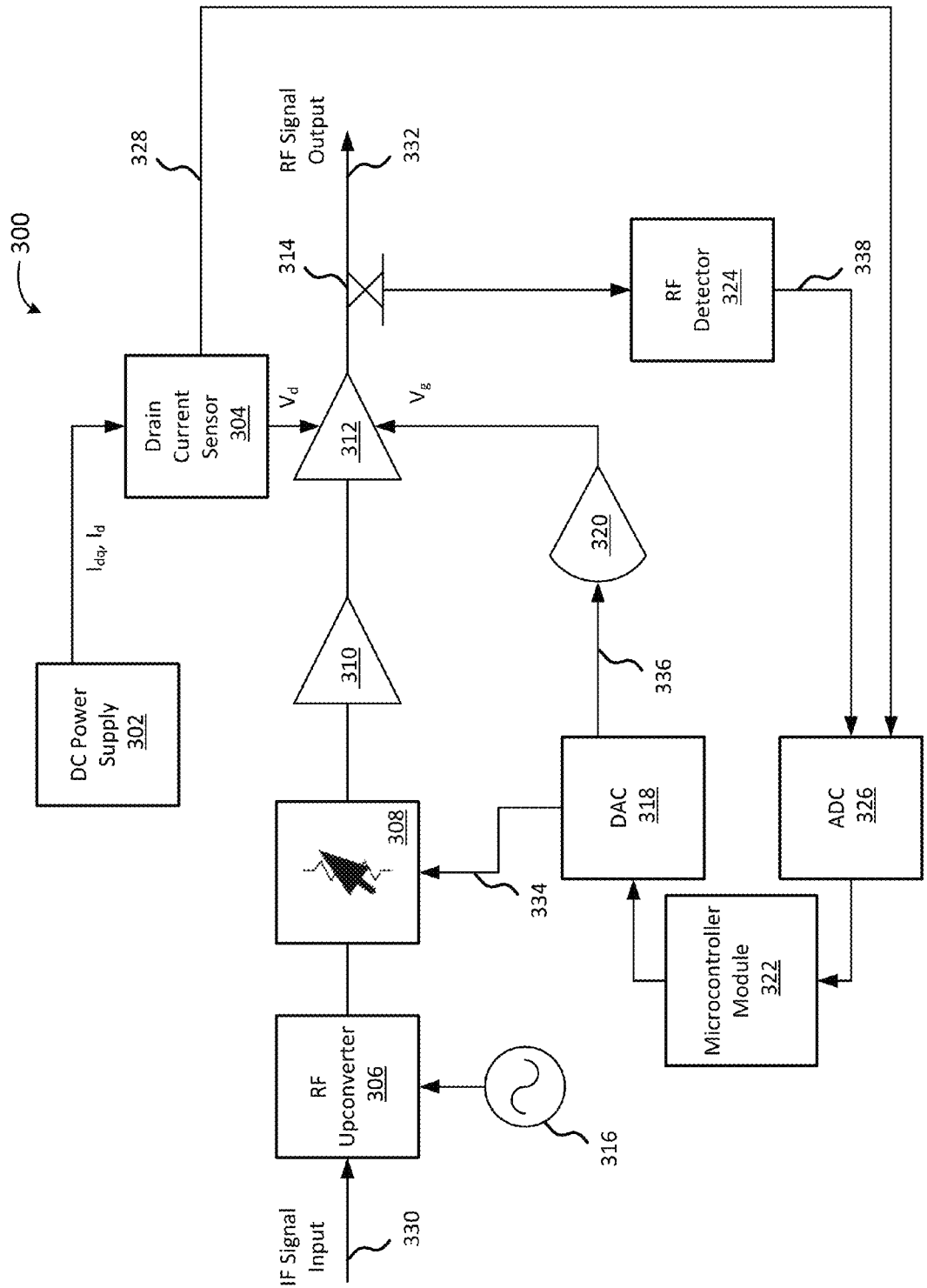
FIG. 3 is a diagram of an exemplary transmitter utilizing a power amplifier in accordance with some embodiments.

FIG. 3 is a diagram of an exemplary transmitter 300 utilizing a power amplifier in accordance with some embodiments. In FIG. 3, the transmitter 300 comprises a direct current (DC) power supply 302, a drain current sensor 304, a radio frequency (RF) upconverter 306, a variable voltage attenuator (VVA) 308, a gain block 310, a power amplifier 312, a coupler 314, a local oscillator 316, a digital-to-analog converter (DAC) 318, a voltage converter 320, a microcontroller module 322, a radio frequency (RF) detector, and an analog-to-digital converter (ADC) 326. As shown, the DC power supply 302 is coupled to the drain current sensor 304, the drain current sensor 304 is coupled to the power amplifier 312 and the ADC 326, the local oscillator 316 is coupled to the RF upconverter 306, the RF upconverter 306 is coupled to the VVA 308, the VVA 308 is coupled to the gain block 310, the gain block 310 is coupled to the power amplifier 312, the power amplifier 312 is coupled to the coupler 314, the coupler 314 is coupled to the RF detector 324, the RF detector 324 is coupled to the ADC 326, the ADC 326 is coupled to the microcontroller module 322, the microcontroller module 322 is coupled to the DAC 318, the DAC 318 is coupled to the VVA 308 and the voltage converter 320, and the voltage converter 320 is coupled to the power amplifier 312. Those skilled in the art will appreciate that the composition or arrangement of the transmitter 300 may vary between different embodiments. For some embodiments, one or more of the components of the transmitter 300, such as the microcontroller module 322, are implemented using a digital device, and that digital device may be similar to the one described and depicted with respect to FIG. 7. Additionally, depending on the embodiment, the transmitter 300 may be included, in whole or in part, by the radio frequency unit (RFU) 200 described and depicted herein with respect to FIG. 2.

The DC power supply 302 may be configured to provide power to various components of the transmitter 300 including, for example, the drain current sensor 304, which in turn may provide power to the power amplifier 312. By this arrangement, the DC power supply 302 can provide the power amplifier 312 with its drain voltage ($V_d$), drain current ($I_d$), and quiescent drain current ($I_{dq}$). The drain current sensor 304 may be configured to measure the drain current ($I_d$) or the quiescent drain current ($I_{dq}$) of the power amplifier 312 as the DC power supply 302 provides such current through the drain current sensor 304. The measured value of the drain current ($I_d$) or the quiescent drain current ($I_{dq}$) may be provided to the ADC 326 for further processing through a connection 328. The measured value of the drain current ($I_d$) or the quiescent drain current ($I_{dq}$) may vary based a number of factors including, for example, how much power is being provided by the DC power supply 302, the bias (e.g., voltage bias) being applied to the power amplifier 312 (e.g., applied to the power amplifier 312's gate), the load on the output of the power amplifier 312, and the power level of a input signal received by the power amplifier 312.

The RF upconverter 306 may be configured to receive an intermediate frequency (IF) signal via an IF signal input 330, and upconvert the IF signal to a radio frequency (RF) signal (e.g., microwave signal) using the local oscillator 316. According to some embodiments, the local oscillator 316 is a RF oscillator, and the RF upconverter 306 comprises a heterodyne system configured to upconvert the IF signal to the RF signal. The RF upconverter 306 may provide the resulting RF signal to another components of the transmitter 300, such as the VVA 308, for additional processing and/or transmission (e.g., over a radio link).

The VVA 308 may be configured to adjust one or more electrical properties of the RF signal provided by the RF upconverter 306 including, for example, the voltage or current of the RF signal. The VVA 308 may be further configured to variably adjust the RF signal according to a control signal 334, which may be received from the microcontroller module 322 by way of the DAC 318.

The gain block 310 may be any form of amplifier suitable for receiving an IF or RF signal and providing a gain to the IF or RF signal. The gain block 310 may be configured to receive the variably-attenuated RF signal from the VVA 308, apply a gain (e.g., a predetermined gain), and provide the resulting RF signal to the power amplifier 312.

The power amplifier 312 may be a GaN power amplifier, and may be configured to receive an input signal (e.g., via a signal input port), amplify the input signal to an output signal, and provide the output signal (e.g., via a signal output port). The power amplifier 312 may receive and powered by a drain current provided a power source, such as the DC power supply 302. Amplification of the input signal to an output signal by the power amplifier 312 may be based on (e.g., controlled by) a bias being applied to the power amplifier 312 (e.g., applied to the power amplifier 312's gate) via a control input. As shown in FIG. 3, the bias may be a voltage bias $V_g$ being provided by the voltage converter 320. The voltage converter 320 may be configured to generate and provide voltage bias $V_g$ according to a control signal 336 received from the microcontroller module 322 as converted by the DAC 318. Once the RF signal received by the power amplifier 312 is amplified, the resulting amplified RF signal may be provided for transmission via an RF signal output 332.

The coupler 314 may be configured to sample or split a signal (e.g., an amplified RF signal) being output from the power amplifier 312. In some embodiments, the coupler 314 samples the output signal from the power amplifier 312 and provides the sampled signal to the RF detector 324 for feedback processing. Upon receiving the sampled signal, the RF detector 324 may be configured to detect the presence of the signal and/or determine one or more characteristics of the sampled signal including, for instance, the frequency, phase, power level (e.g., amplitude) of the received sampled signal. The RF detector 324 may inform another component of the sample signal's presence and/or characteristics via line 338. For instance, the RF detector 324 may inform the microcontroller module 322 of the sample signal's presence and/or characteristics through ADC 326 and via the line 388.

The microcontroller module 322 may be configured to control one or more components of the transmitter 300 via one or more control signal outputs. The microcontroller module 322 may be configured to control one or more components of the transmitter 300 according to input signals received from one or components of the transmitter 300. The microcontroller module 322 may include a processor to facilitate its operation. As described herein, the microcontroller module 322 may be implemented, in whole or in part, using a digital device. As such, analog signals to the microcontroller module 322 (e.g., from the drain current sensor 304 and the RF detector 324) may converted to a digital signal by the ADC 326 before it is received, and digital signals from the microcontroller module 322 (e.g., for the VVA 308 and for the voltage converter 320) may be converted to an analog signal by the DAC 318. For some embodiments, one or more of the methods described herein are performed, in whole or in part, by the microcontroller module 322. The processor included by the microcontroller module 322 may facilitate the performance of the methods.

Figure 4:
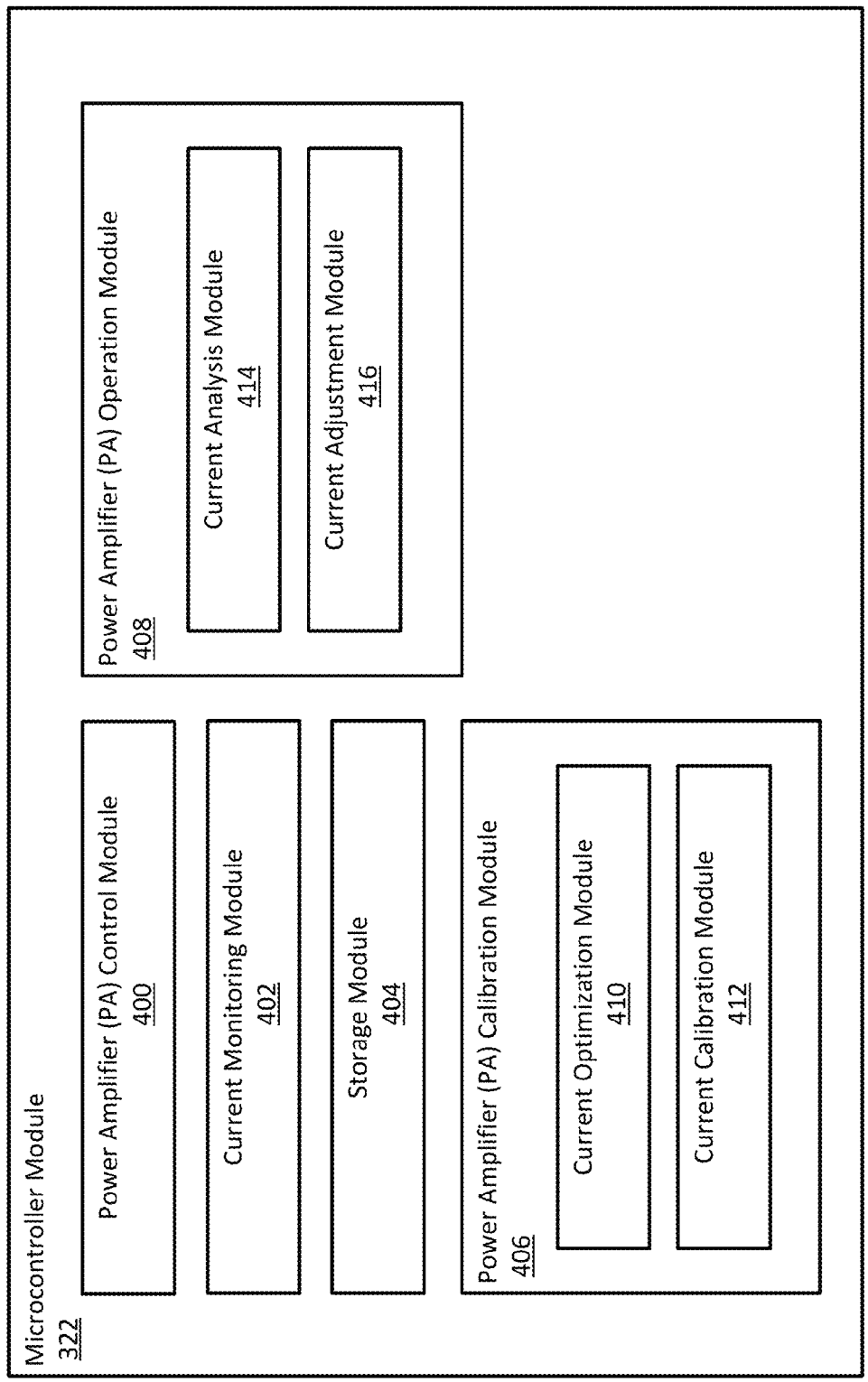
FIG. 4 is a block diagram of an exemplary microcontroller module that can be utilized with a power amplifier in accordance with some embodiments.

FIG. 4 is a block diagram of the microcontroller module 322 that can be utilized with a power amplifier in accordance with some embodiments. In FIG. 4, the microcontroller module 322 comprises a power amplifier (PA) control module 400, a current monitoring module 402, a storage module 404, a power amplifier (PA) calibration module 406, and a power amplifier (PA) operation module 408. The PA calibration module 406 comprises a current optimization module 410 and a current calibration module 412. The PA operation module 408 comprises a current analysis module 414 and a current adjustment module 416. Those skilled in the art will appreciate that the composition or arrangement of microcontroller module 322 may vary between different embodiments. As described herein, one or more of the methods described herein may be performed, in whole or in part, by the microcontroller module 322. As also described herein, the microcontroller module 322 may be implemented, in whole or in part, using a digital device, and that digital device may be similar to the one described and depicted with respect to FIG. 7.

The PA control module 400 may be configured to facilitate control of the power amplifier 312, and may do so by controlling drain current of the power amplifier 312. For some embodiments, the PA control module 400 controls the drain current of the power amplifier 312 by controlling the voltage bias $V_g$ provided to the power amplifier 312. In some embodiments, the voltage converter 320 provides the voltage bias $V_g$ to the power amplifier 312, and the PA control module 400 controls the voltage converter 320 via control signals through the DAC 318.

The current monitoring module 402 may be configured to facilitate measurement of the drain current of the power amplifier 312, and may do so by through the drain current sensor 304. According to some embodiments, the drain current sensor 304 measures the drain current provided by the DC power supply 302 to the power amplifier 312, and provides the measured value to the current monitoring module 402 as a signal. The signal provided by the drain current sensor 304 may be analog and require conversion through the ADC 326 before being received by the current monitoring module 402.

The storage module 404 may be configured to facilitate storage and retrieval of various data as various components of the microcontroller module 322 perform operations. In some embodiments, the storage module 404 store and subsequently retrieves drain current values used by the PA calibration module 406 and/or the PA operation module 408 during a calibration or operation phase of the power amplifier 312. The storage module 404 may utilize or include some form of memory (e.g., flash memory) and/or datastore to facilitate storage and retrieval of data for operations of the microcontroller module 322.

The PA calibration module 406 may be configured to facilitate calibration phase operations, as described herein, with respect to the power amplifier 312. For example, during calibration of the power amplifier 312, the current optimization module 410 may be configured to determine one or more quiescent drain current ($I_{dq}$) values for the power amplifier 312 for one or more operational parameters under which the power amplifier 312 may be operated, or is expected to operate, when used for signal transmission in the transmitter 300. The operational parameters for the power amplifier 312 may, for example, comprise permutations of the following operational parameters: a set of frequencies $F=\{f_1, f_2, f_3, \ldots f_p\}$ expected for the input signals during operation of the power amplifier 312; and a set of power amplifier temperatures $T=\{t_1, t_2, t_3, \ldots t_m\}$ expected during operation of the power amplifier 312. Determining one or more quiescent drain current ($I_{dq}$) values for the power amplifier 312 operating under the operational parameters may comprise adjusting the quiescent drain current ($I_{dq}$) of the power amplifier 312, via the voltage bias $V_g$ applied by the voltage converter 320, while the power amplifier 312 is operating under the operational parameters. The quiescent drain current ($I_{dnq}$) values determined during by the current optimization module 410 may be regarded as a set of optimized quiescent drain current ($I_d$) values for the power amplifier 312 while operating under the operational parameters. Additionally, the one or more quiescent drain current ($I_{dq}$) values determined by the current optimization module 410 for the power amplifier 312 may be stored as saved drain current data by the storage module 404, and may be done so according to their one or more corresponding operational parameters (e.g. to permit future retrieval based on those operational parameters).

The current calibration module 412 may be configured to determine a set of non-quiescent drain current ($I_{dnq}$) values for the power amplifier 312 for a set of power levels $P=\{p_1, p_2, p_3, \ldots p_n\}$ and additional operational parameters under which the power amplifier 312 may be operated, or is expected to operate when used for signal transmission in the transmitter 300. The additional operational parameters may comprise permutations of the following operational parameters: a set of frequencies $F=\{f_1, f_2, f_3, \ldots f_p\}$ expected for the input signals during operation of the power amplifier 312; and a set of power amplifier temperatures $T=\{t_1, t_2, t_3, \ldots t_m\}$ expected during operation of the power amplifier 312. The non-quiescent drain current ($I_{dnq}$) values determined by the current calibration module 412 may be regarded as a set of calibrated drain current ($I_d$) values for the power amplifier 312 while operating under the operational parameters. Additionally, the non-quiescent drain current ($I_{dnq}$) values determined by the current calibration module 412 for the power amplifier 312 may be stored as saved drain current data by the storage module 404, and may be done so according to their one or more corresponding operational parameters (e.g. to permit future retrieval based on those operational parameters).

The PA operation module 408 may be configured to facilitate operation phase operations, as described herein, with respect to the power amplifier 312. For instance, during the operation phase of the power amplifier 312 (e.g., when the power amplifier 312 is being used in the transmitter 300 to transmits signals), the current analysis module 414 may be configured to receive a present value of the drain current of the power amplifier 312 as measured by the drain current sensor 304, and compare the present drain current value to a saved drain current value (e.g., an optimized quiescent drain current value or a calibrated drain current value) determined during the calibration phase and saved through the storage module 404. Through the storage module 404, the current analysis module 414 may obtain the saved drain current value from the saved drain current data. As described herein, for some embodiments, the saved drain current value to which the present drain current value is compared is a saved drain current value that associated with one or more present operational parameters under which the power amplifier 312 is presently operating while the transmitter 300 is operating.

Based on whether the difference between the present drain current value and the saved drain current value satisfies a particular condition, the current analysis module 414 may maintain the drain current at its present drain current value or control (e.g., adjust) the drain current to match or sufficiently match the saved drain current value.

The current adjustment module 416 may be configured to control the drain current when the drain current needs to be controlled to match or sufficiently match the present drain current value to the saved drain current value. According to some embodiments, the current adjustment module 416 controls the drain current to the saved drain current value by controlling the voltage bias $V_g$ applied by the voltage converter 120 and measuring the present drain current value as provided by the drain current sensor 304 until the present drain current value matches or substantially matches the saved drain current value.

Those skilled in the art will appreciate that the components of FIG. 3 described above with respect to the components of FIG. 4 are merely examples of components that may be used with the microcontroller module 322, and that other components may also be utilized in some embodiments.

Figure 5:
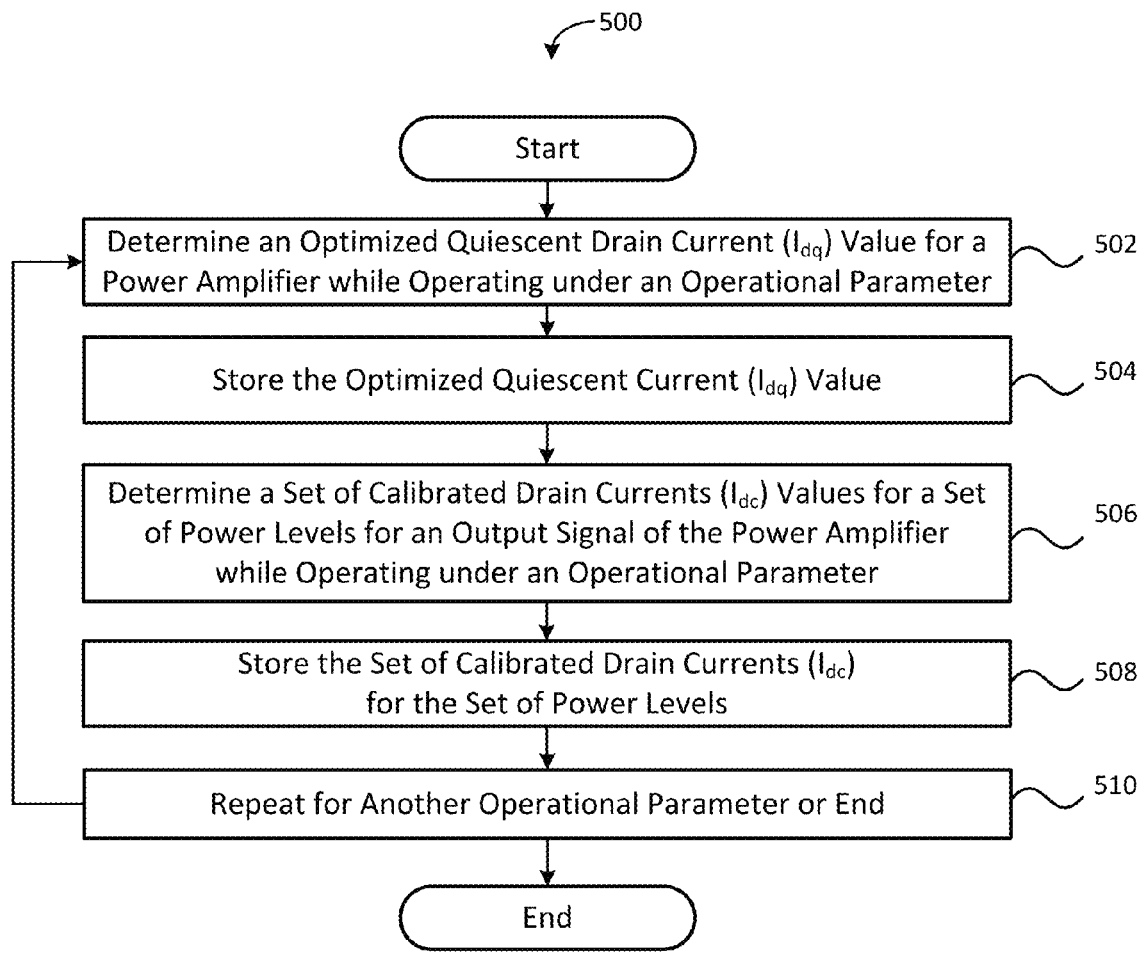
FIG. 5 is a flow diagram of an example method for calibrating a power amplifier in accordance with some embodiments.

FIG. 5 is a flow diagram of an example method 500 for calibrating a power amplifier in accordance with some embodiments. The method 500 begins at step 502 with the current optimization module 410 determining an optimized quiescent drain current ($I_{dq}$) value for the power amplifier 312 while the power amplifier 312 is operation under an operational parameter. At step 504, the storage module 404 stores the optimized quiescent current ($I_{dq}$) value, and may store it as saved drain current data. At step 506, the current calibration module 412 determines a set of calibrated drain current ($I_{dc}$) values for a set of power levels for an output signal of the power amplifier 312 while the power amplifier 312 is operating under the operational parameter. At step 508, the storage module 404 stores the set of calibrated drain current ($I_{dc}$) values, and may store it as saved drain current data. At step 510, can either continue to step 502 and repeat the method 500 for another operational parameter or end the method 500.

Though the steps of the method 500 may be depicted and described in a certain order, those skilled in the art will appreciate that the order in which the steps are performed may vary between different embodiments. Additionally, those skilled in the art will appreciate that the components described above with respect to the method 500 are merely examples of components that may be used with the method 500, and that other components may also be utilized in some embodiments.

Figure 6:
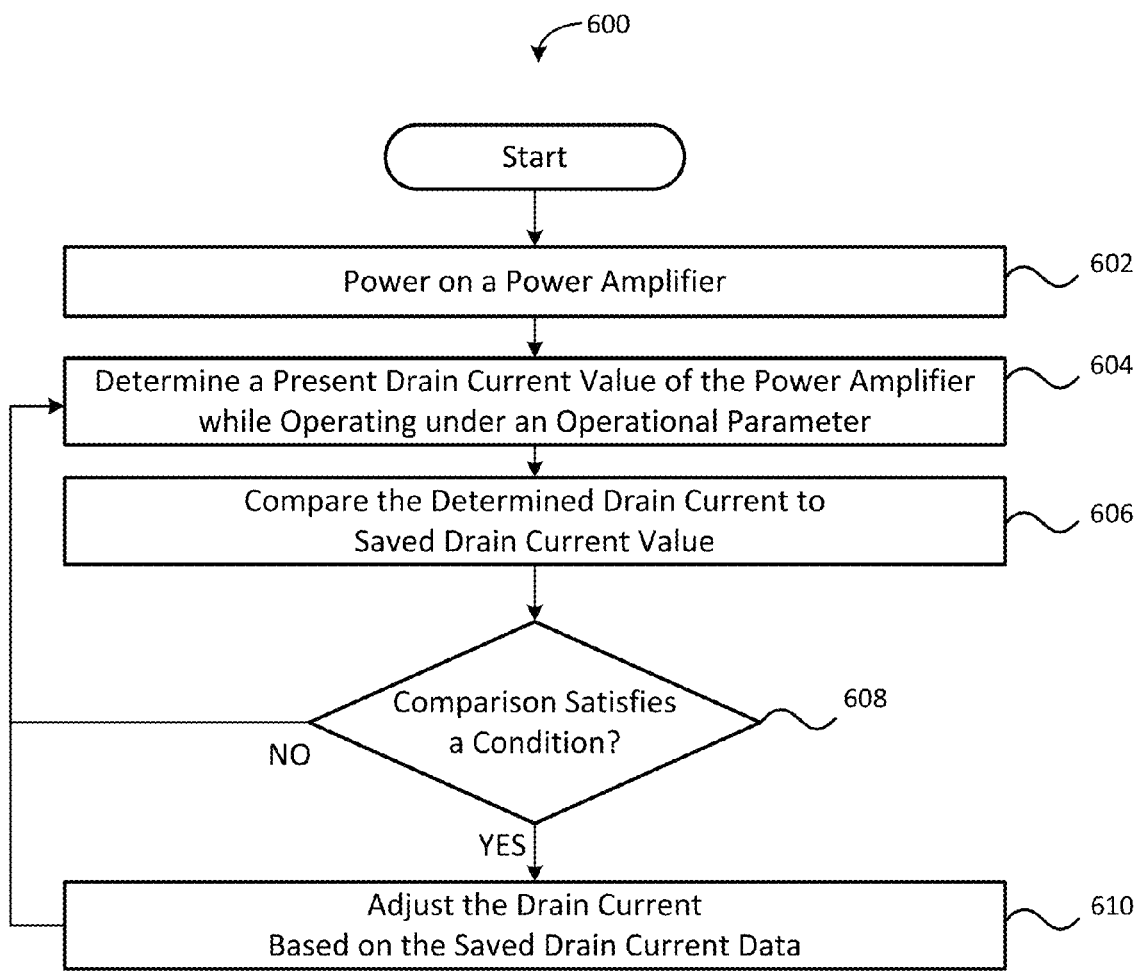
FIG. 6 is a flow diagram of an example method for operating a power amplifier in accordance with some embodiments.

FIG. 6 is a flow diagram of an example method 600 for operating a power amplifier in accordance with some embodiments. The method 600 begins at step 602 the PA control module 400 powers on the power amplifier 312. At step 604, the current monitoring module 402 determines (e.g., measures) a present drain current value of the power amplifier 312 while the power amplifier 312 is operating under an operational parameter. At step 606, the current analysis module 414 compares the determined drain current value to a saved drain current value (e.g., from the saved drain current data), which may have been generated during the method 500. If at step 608, the current analysis module 414 determines that the comparison of the determined drain current value to saved drain current value satisfies a condition (e.g., the difference between the determined drain current value and the saved drain current value is more than an error threshold), the method 600 continues to step 610. If the current analysis module 414 determines otherwise, the method 600 continue to and repeats itself from step 604. At step 610, the current adjustment module 416 adjusts the drain current of the power amplifier 312 based on the saved drain current value.

Though the steps of the method 600 may be depicted and described in a certain order, those skilled in the art will appreciate that the order in which the steps are performed may vary between different embodiments. Additionally, those skilled in the art will appreciate that the components described above with respect to the method 600 are merely examples of components that may be used with the method 600, and that other components may also be utilized in some embodiments.

Figure 7:
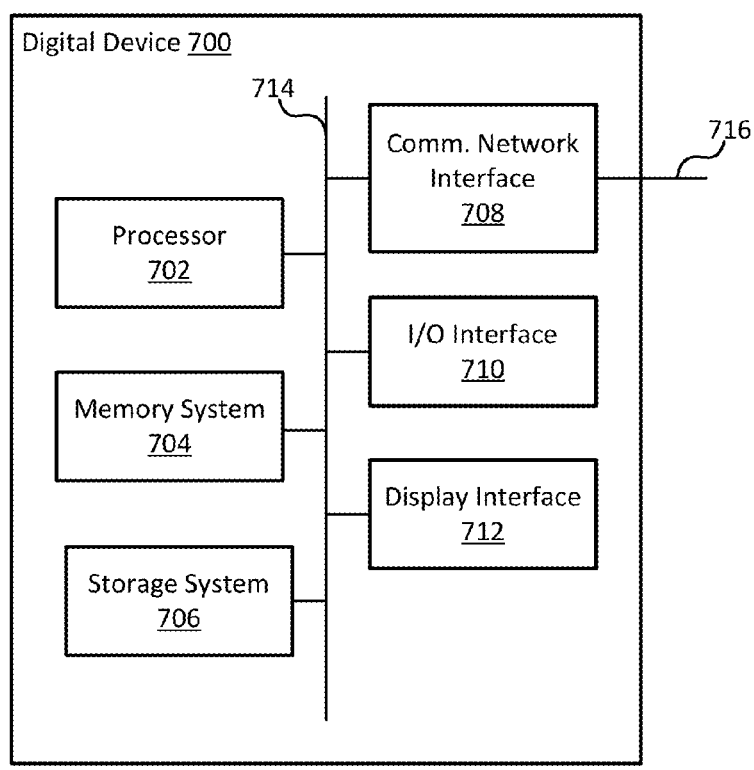
FIG. 7 depicts an example digital device according to some embodiments.

FIG. 7 depicts an example digital device 700 according to some embodiments. The digital device 700 comprises a processor 702, a memory system 704, a storage system 706, a communication network interface 708, an I/O interface 710, and a display interface 712 communicatively coupled to a bus 714. The processor 702 may be configured to execute executable instructions (e.g., programs). In some embodiments, the processor 702 comprises circuitry or any processor capable of processing the executable instructions.

The memory system 704 is any memory configured to store data. Some examples of the memory system 704 are storage devices, such as RAM or ROM. The memory system 704 may comprise the RAM cache. In various embodiments, data is stored within the memory system 704. The data within the memory system 704 may be cleared or ultimately transferred to the storage system 706.

The storage system 706 is any storage configured to retrieve and store data. Some examples of the storage system 706 are flash drives, hard drives, optical drives, and/or magnetic tape. In some embodiments, the digital device 700 includes a memory system 704 in the form of RAM and a storage system 706 in the form of flash data. Both the memory system 704 and the storage system 706 comprise computer readable media that may store instructions or programs that are executable by a computer processor including the processor 702.

The communication network interface (com. network interface) 708 may be coupled to a data network via the link 716. The communication network interface 708 may support communication over an Ethernet connection, a serial connection, a parallel connection, or an ATA connection, for example. The communication network interface 708 may also support wireless communication (e.g., 802.11 a/b/g/n, WiMAX). It will be apparent to those skilled in the art that the communication network interface 708 may support many wired and wireless standards.

The optional input/output (I/O) interface 710 is any device that receives input from the user and output data. The optional display interface 712 is any device that may be configured to output graphics and data to a display. In one example, the display interface 712 is a graphics adapter.

It will be appreciated by those skilled in the art that the hardware elements of the digital device 700 are not limited to those depicted in FIG. 7. A digital device 700 may comprise more or less hardware elements than those depicted. Further, hardware elements may share functionality and still be within various embodiments described herein. In one example, encoding and/or decoding may be performed by the processor 702 and/or a co-processor located on a GPU.

One or more functions may be stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some embodiments. Those skilled in the art are familiar with instructions, processor(s), and storage medium.

Various embodiments are described herein as examples. It will be apparent to those skilled in the art that various modifications may be made and other embodiments can be used.

We claim:

1. A system comprising:
   a power amplifier having an output signal and a drain current;
   a power amplifier calibration module configured to determine an optimized quiescent drain current value for the drain current while the power amplifier is operating under an operational parameter, and determine a set of calibrated drain current values for the drain current, the set of calibrated drain current values being calibrated for a set of power levels for the output signal while the power amplifier is operating under the operational parameter;
   a storage module configured to store the optimized quiescent drain current value and the set of calibrated drain current values as saved drain current data; and
   a power amplifier operation module configured to compare the drain current to a particular drain current value in the saved drain current data, determine whether the comparison satisfies a condition, and adjust the drain current based on the particular drain current value if the condition is determined to be satisfied.

2. The system of claim 1, wherein the operational parameter comprises a plurality of operational parameters.

3. The system of claim 1, wherein the power amplifier is a GaN power amplifier.

4. The system of claim 1, wherein the operational parameter comprises a frequency of an input signal of the power amplifier, a phase of an input signal of the power amplifier, a power level of an input signal of the power amplifier, or a temperature of the power amplifier.

5. The system of claim 1, wherein the storing the optimized quiescent drain current value comprises storing the optimized quiescent drain current value in association with the operational parameter.

6. The system of claim 1, wherein the storing the set of calibrated drain current values comprises storing the set of calibrated drain current values in association with the operational parameter or the set of power levels.

7. The system of claim 1, wherein the condition is that a difference between the present drain current value and the particular drain current value in the saved drain current data is less than, equal to, or larger than a predetermined value.

8. The system of claim 1, wherein the adjusting the drain current based on the particular drain current value comprises adjusting the drain current to match or substantially match the particular drain current value in the saved drain current data.

9. The system of claim 1, wherein the adjusting the drain current based on the particular drain current value comprises adjusting a voltage bias of the power amplifier such that the drain current matches or substantially matches the particular drain current value in the saved drain current data.

10. The system of claim 1, wherein the particular drain current value is associated with a present operational parameter under which the power amplifier is presently operating.

11. A method comprising:
    determining an optimized quiescent drain current value for a drain current of a power amplifier while the power amplifier is operating under an operational parameter;
    storing the optimized quiescent drain current value as saved drain current data;
    determining a set of calibrated drain current values for the drain current, the set of calibrated drain current values being calibrated for a set of power levels for an output signal of the power amplifier while the power amplifier is operating under the operational parameter;
    storing the set of calibrated drain current values in the saved drain current data;
    comparing the drain current to a particular drain current value in the saved drain current data;
    determining whether the comparison satisfies a condition; and
    adjusting the drain current based on the particular drain current value if the condition is determined to be satisfied.

12. The method of claim 11, wherein the operational parameter comprises a plurality of operational parameters.

13. The method of claim 11, wherein the power amplifier is a GaN power amplifier.

14. The method of claim 11, wherein the operational parameter comprises a frequency of an input signal of the power amplifier, a phase of an input signal of the power amplifier, a power level of an input signal of the power amplifier, or a temperature of the power amplifier.

15. The method of claim 11, wherein the storing the optimized quiescent drain current value comprises storing the optimized quiescent drain current value in association with the operational parameter.

16. The method of claim 11, wherein the storing the set of calibrated drain current values comprises storing the set of calibrated drain current values in association with the operational parameter or the set of power levels.

17. The method of claim 11, wherein the condition is that a difference between the present drain current value and the particular drain current value in the saved drain current data is less than, equal to, or larger than a predetermined value.

18. The method of claim 11, wherein the adjusting the drain current based on the particular drain current value comprises adjusting the drain current to match or substantially match the particular drain current value in the saved drain current data.

19. The method of claim 11, wherein the adjusting the drain current based on the particular drain current value comprises adjusting a voltage bias of the power amplifier such that the drain current matches or substantially matches the particular drain current value in the saved drain current data.

20. The method of claim 11, wherein the particular drain current value is associated with a present operational parameter under which the power amplifier is presently operating.

21. A system comprising:
means for determining an optimized quiescent drain current value for a drain current of a power amplifier while the power amplifier is operating under an operational parameter;
means for storing the optimized quiescent drain current value as saved drain current data;
means for determining a set of calibrated drain current values for the drain current, the set of calibrated drain current values being calibrated for a set of power levels for an output signal of the power amplifier while the power amplifier is operating under the operational parameter;
means for storing the set of calibrated drain current values in the saved drain current data;
means for comparing the drain current to a particular drain current value in the saved drain current data;
means for determining whether the comparison satisfies a condition; and
means for adjusting the drain current based on the particular drain current value if the condition is determined to be satisfied.

* * * * *